(12) United States Patent
Haryu et al.

(10) Patent No.: US 10,296,131 B2
(45) Date of Patent: May 21, 2019

(54) MONITORING AND CONTROLLING APPARATUS (71) Applicant: KABUSHIKI KAISHA TOSHIBA, Minato-ku (JP)

(72) Inventors: Atsuo Haryu, Tokorozawa (JP); Akimasa Nakai, Saitama (JP); Shinji Sakurai, Kawaguchi (JP); Susumu Yoshizawa, Fuchu (JP); Katsuya Kasai, Fuchu (JP); Kenichi Hosoya, Fuchu (JP); Eiji Watanabe, Fuchu (JP); Yusuke Tsuboi, Chofu (JP); Kazuaki Omomo, Sagamihara (JP); Toshio Tagawa, Hino (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 248 days.

(21) Appl. No.: 15/397,977

(22) Filed: Jan. 4, 2017

(65) Prior Publication Data
US 2017/0285839 A1 Oct. 5, 2017

(30) Foreign Application Priority Data
Mar. 30, 2016 (JP) .................................. 2016-068835

(51) Int. Cl.
*A47B 47/00* (2006.01)
*G06F 3/041* (2006.01)
(Continued)

(52) U.S. Cl.
CPC ............ *G06F 3/0416* (2013.01); *A47B 47/00* (2013.01); *E05F 15/75* (2015.01); *G05B 19/04* (2013.01);
(Continued)

(58) Field of Classification Search
CPC ....... G06F 3/0416; G06F 1/182; G05B 19/04; G06Q 10/087; H05K 5/0208;
(Continued)

(56) References Cited

U.S. PATENT DOCUMENTS 8,917,513 B1 * 12/2014 Hazzard ............... H05K 7/1498
211/153
2012/0133510 A1 * 5/2012 Pierce .................... H04Q 1/026
340/540

(Continued)

FOREIGN PATENT DOCUMENTS

JP 4-29509 1/1992
JP 9-9424 1/1997
(Continued)

*Primary Examiner* — Hung T Nguyen
(74) *Attorney, Agent, or Firm* — Oblon, McClelland, Maier & Neustadt, L.L.P.

(57) ABSTRACT

A monitoring and controlling apparatus includes a functional cabinet, functional units, and a control cabinet. The functional cabinet includes a plurality of frames and a door at an opening of at least a part of the frames, each frame having a predetermined accommodation size. Each functional unit is detachably accommodated in respective frame and including a circuit and a component for a function of the functional unit. The control cabinet is disposed next to the functional cabinet, and configured to monitor and control the functional units.

7 Claims, 6 Drawing Sheets (51) Int. Cl.
    *E05F 15/75*     (2015.01)
    *H05K 5/02*     (2006.01)
    *G05B 19/04*     (2006.01)
    *H05K 7/14*     (2006.01)

(52) U.S. Cl.
    CPC ......... *H05K 5/0208* (2013.01); *H05K 7/1467* (2013.01); *H05K 7/1481* (2013.01)

(58) Field of Classification Search
    CPC ...... H05K 7/1481; H05K 7/1467; H05K 5/02; H04Q 9/00; E05F 15/75; A47B 47/00
    USPC ......... 340/541, 542, 545.1, 545.6, 565, 679; 361/724, 726, 727
    See application file for complete search history.

(56) References Cited

U.S. PATENT DOCUMENTS

2015/0371187 A1* 12/2015 Irwin ................ G06Q 10/0836
    705/72
2018/0064277 A1* 3/2018 Wei .................... G07C 9/00182

FOREIGN PATENT DOCUMENTS

| | | |
|---|---|---|
| JP | 2001-326472 | 11/2001 |
| JP | 2004-97532 | 4/2004 |
| JP | 2005-210900 | 8/2005 |
| JP | 2006-119860 | 5/2006 |
| JP | 2006-246665 | 9/2006 |
| JP | 2010-186438 | 8/2010 |
| JP | 2011-20802 | 2/2011 |

\* cited by examiner

UNIT MANAGEMENT TABLE 13a

| CUBE NUMBER | FUNCTIONAL ID | AUTHENTICATION INFORMATION | STATE | | |
| --- | --- | --- | --- | --- | --- |
| | | | MODULE #1 | MODULE #2 | MODULE #3 |
| 001 | CPU1 | USER 1, USER 2 ... | 1 | 2 | 1 | ... |
| 002 | CPU2 | USER 1, USER 2 ... | 1 | 1 | 1 | ... |
| 003 | POWER SUPPLY 1 | USER 3, USER 4 ... | ... | ... | ... | ... |
| ... | | | | | |

FIG. 5

UNLOCK HISTORY MANAGEMENT TABLE 13b

| NUMBER | DATA AND HOUR | USER ID | CONTENTS |
| --- | --- | --- | --- |
| 1 | 2016-02-09 08:15:00 | USER 1 | DOOR 1 IS UNLOCKED |
| 2 | 2016-02-09 08:15:05 | | DOOR 1 IS OPENED |
| 3 | 2016-02-09 08:16:05 | | DOOR 1 IS CLOSED |
| 4 | 2016-02-09 11:03:00 | USER 2 | DOOR 1 IS UNLOCKED |
| 5 | 2016-02-09 11:03:08 | | DOOR 1 IS OPENED |
| 6 | 2016-02-09 11:16:09 | | DOOR 1 IS CLOSED |
| 7 | 2016-02-10 15:02:00 | USER 1 | DOOR 1 IS UNLOCKED |
| ... | | | ... |

MONITORING AND CONTROLLING APPARATUS

CROSS-REFERENCE TO RELATED APPLICATIONS

This application is based upon and claims the benefit of priority from Japanese Patent Application No. 2016-068835, filed on Mar. 30, 2016; the entire contents of which are incorporated herein by reference.

FIELD

Embodiments described herein relate generally to a monitoring and controlling apparatus.

BACKGROUND

An electric power plant such as a power plant includes a monitoring and controlling apparatus to monitor and control each equipment in a plant, in which required functions are incorporated.

For finding out a trouble occurrence position in the apparatus and taking actions, a lot of time and labor have been required. The monitoring and controlling apparatus includes gathered wirings for monitoring and controlling and power lines for power feeding to equipment. Accordingly, when a trouble occurs, much time and labor are required for an operator to go to a site, open a door of the monitoring and controlling apparatus to check where and which wiring passes in the monitoring and controlling apparatus.

An inside of the apparatus can be easily accessed by opening approximately one or two pieces of door of the monitoring and controlling apparatus, but the trouble may become larger due to an inexperienced operator carelessly touching components and circuits.

Adding a new function to the monitoring and controlling apparatus requires much time and labor because of a necessity of a total change including wirings.

As stated above, the conventional monitoring and controlling apparatus did not have a structure in consideration of an update of the functions and a maintenance work of the operator. Further, opening/closing of the door was limited by a physical key, but security was not necessarily sufficient other than the physical key. When the door is opened, the operator can access all functions, but he/she may carelessly touch an untouchable part.

In recent years, an assembling structure has been devised which includes function-based units with standard outer sizes stacked with each other and a cabinet covering the stacked units.

However, an addition or an exchange of a function in a middle unit among the stacked units requires detach of all stacked units over the middle unit, and this makes workability worse. Besides, security for individual unit is not considered.

An object of the present invention is to provide a monitoring and controlling apparatus where an operator is able to access to a desired function and immediately work in addition to securing security during recovery, maintenance, update, and expansion of functions.

DETAILED DESCRIPTION

A monitoring and controlling apparatus of an embodiment includes a functional cabinet, functional units, and a control cabinet. The functional cabinet includes a plurality of frames each with a predetermined accommodation size, and a door openably/closably provided at an opening of at least one frame among the plurality of frames.

The functional unit is exchangably accommodated in the frame of the functional cabinet, and includes a circuit and component for a function of the functional unit. The functional unit includes collection circuitry and a notification circuit. The collection circuitry collects and outputs operation information of the circuit and the component. The notification circuit notifies a state in the functional unit or a position of the functional unit.

The control cabinet is disposed next to the functional cabinet, and has a monitoring and controlling function to monitor and control the functional units accommodated in the frames. The control cabinet has a management table and a controller.

The management table memorizes unit numbers, identification information, and flags associated with each other. The unit number is information to identify the functional unit accommodating the circuit and the component. The identification information indicates a function of the functional unit. The flag indicates operation states of the circuit and the component.

When the flag of the operation states of the circuit and the component in the management table is updated based on the operation information output from the collection circuitry, the controller specifies the circuit and the component where the change of the flag is detected and the functional unit accommodating the circuit and the component. The controller makes the notification circuit of the specified functional unit notify the position or the operation state of the functional unit.

Figure 1:
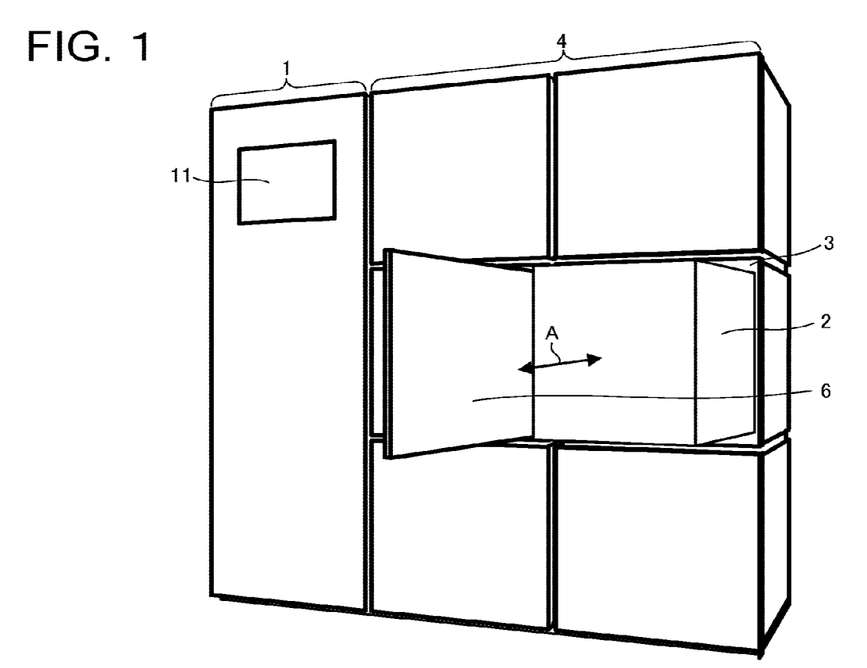
FIG. 1 is a view illustrating an appearance configuration of a monitoring and controlling apparatus according to an embodiment.

Hereinafter, the embodiment is described in detail with reference to the drawings. FIG. 1 illustrates a configuration of a monitoring and controlling apparatus of the embodiment.

As illustrated in FIG. 1, the monitoring and controlling apparatus of the embodiment includes a functional cabinet 4 and a control cabinet 1 disposed next to the functional cabinet 4.

The functional cabinet 4 is a casing, separated into approximately the same size in vertical and horizontal, and has accommodation parts 3 as a plurality of frames where one surface of the accommodation part 3, for example, a front surface is opened.

The accommodation part 3 accommodates a cube 2 as an exchangable (detachable in an arrow A direction) functional unit. A position providing the opening of the accommodation part 3 may be a side surface or an upper surface in addition to the front surface.

The control cabinet 1 is a casing, and circuits, components, other tools, and so on to control the apparatus are accommodated inside thereof. The control cabinet 1 illustrated in FIG. 1 has a height for three pieces (three stages) of accommodation parts 3 (an equivalent height with the functional cabinet 4) and a width for one piece (one column) of accommodation part 3. A size of the control cabinet 1 is not limited to this constitution.

Figure 2:
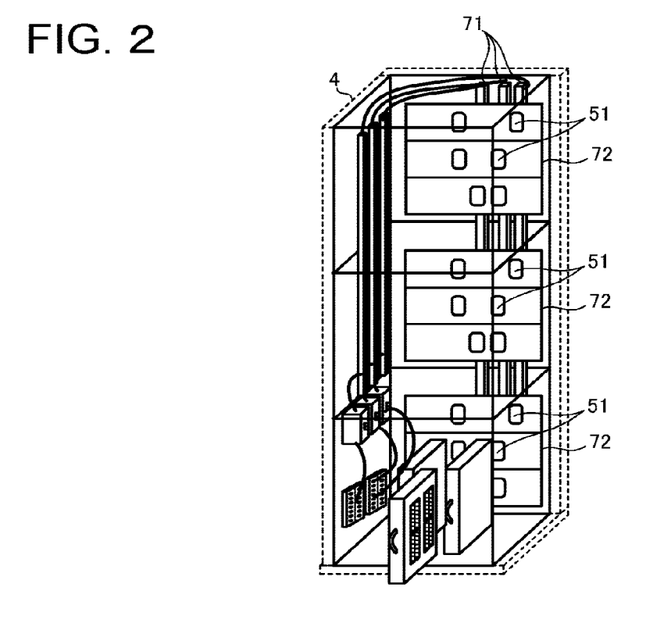
FIG. 2 is a view illustrating an internal configuration of one-column part (three stages) of a functional cabinet of the monitoring and controlling apparatus.

The functional cabinet 4 includes a plurality of accommodation parts 3 which are separated by an outer wall at outside and a framework at inside. In FIG. 1, the functional cabinet 4 consists of two horizontal columns, and three vertical stages of the accommodation parts 3. As illustrated in FIG. 2, it may consist of one horizontal column, and three vertical stages. The cube 2 is a content accommodated in the accommodation part 3, and it is different by each function.

The accommodation part 3 is an inside frame (an inner space) formed by separating the inside of the functional cabinet 4 by the framework. The accommodation part 3 has a predetermined accommodation size (600 mm in height, 600 mm in width, and 600 mm in depth). The cube 2 is accommodated in at least a part of the plurality of accommodation parts 3.

Each accommodation part 3 of the functional cabinet 4 has a door 6 capable of individually opening/closing at a front surface opening. The door 6 has an electronic lock 27 (refer to FIG. 3), and lock and unlock are possible by control from the control cabinet 1 side. The door 6 is unlocked by the electronic lock 27 to be opened. All the doors 6 need not have the electronic lock 27, but at least a part of the doors 6 may have the electronic lock 27.

The door 6 has a shape capable of being commonly used by the plurality of accommodation parts 3, and a design of a surface is changeable. Namely, a part or all of a panel at the surface of the door 6 can be exchanged. Examples of the panel include a skeleton panel, a black panel, and a punching panel.

For example, when all the doors 6 are the black panel, an external appearance becomes uniform. The security can be kept because a person who does not know the inside of the functional cabinet 4 cannot recognize an inside of each door 6 from the external appearance.

The cube 2 has the circuit and component for the function of the cube (Hereinafter, they are called as a "module". Refer to an image 61 in FIG. 8). The cube 2 has a plug 52 for power connection at a back side of the functional cabinet 4 (refer to FIG. 6).

Each cube 2 has the module as the circuit and component for a function to monitor and control a power generation and substation facility, a transmission and distribution plant, and so on. As an example, for example, the cube 2 of the accommodation part 3 at a left side of an upper stage has an A-system control module including a CPU which controls a main circuit (A system) of a certain electric power facility among the six pieces of accommodation parts 3 of the functional cabinet 4.

The cube 2 of the accommodation part 3 at a right side of the upper stage has a B-system control module including a CPU which controls a sub circuit (B system) of the certain electric power facility.

The cube 2 of the accommodation part 3 at a left side of a middle stage has an A-system power supply module which supplies electric power for a circuit component including the CPU of the A-system. The cube 2 of the accommodation part 3 at a right side of the middle stage has a B-system power supply module which supplies electric power for a circuit component including the CPU of the B-system.

The cube 2 of the accommodation part 3 at a left side of a lower stage has a module of an external cable terminal block for the A-system. The cube 2 of the accommodation part 3 at a right side of the lower stage has a module of an external cable terminal block for the B-system.

Besides, the external cable terminal block is made up of supplies capable of being used until abolishment of a power plant, or has a structure in which external cables can be easily replaced to the terminal block after update without individually disconnecting the external cable at an update time.

This structure is a three-dimensional frame structure (DIN frame structure) capable of attaching and detaching a component by one touch in three dimensions, and the CPU, I/O functions are consolidated to be unitized. Accordingly, it is possible to attach and detach by each unit. According to this structure, it is possible to slide and draw out the unit to a near side by a rail frame provided at a base part.

A layout example of the cubes 2 as stated above is an example, and the cubes 2 can be variously replaced. For example, the power supply module may be disposed at the upper stage. In this case, the module with heavy weight is disposed at a high position, and therefore takeout of the cube 2 may become difficult for its repair or exchange. This conceivably results in the cube 2 at the high position having a lift mechanism. The lift mechanism is, for example, a lift-type hanging cabinet mechanism.

As illustrated in FIG. 2, a busbar 71 (hereinafter, called as a "power supply BUS 71") for power feeding to each cube 2 and a contact plate 72 are disposed at a back part of each column of the functional cabinet 4. A socket 51 as an electric connector connected to the power supply BUS 71 is disposed at the contact plate 72. The contact plate 72 is a plate-state member, and the socket 51 is disposed at a surface thereof.

The socket 51 is detachably attached to the plug 52 at the cube 2 side (refer to FIG. 6) to supply power by each cube 2 or each module. Note that the socket 51 may be directly connected to the power supply BUS 71 without an intermediary of the contact plate 72. Incidentally, the contact plate 72 may be successfully used for alignment with the plug 52 at the cube 2 side.

Figure 3:
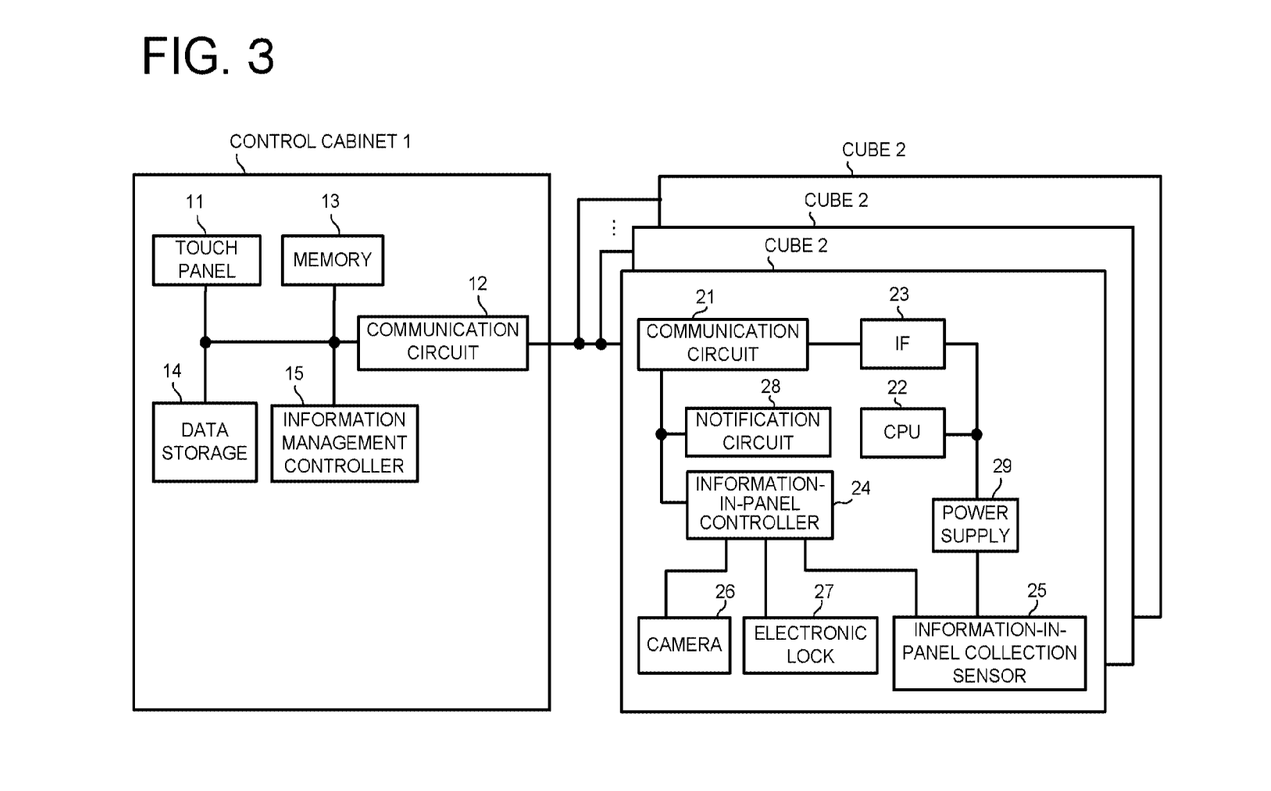
FIG. 3 is a view illustrating a configuration of a control system of the monitoring and controlling apparatus.

As illustrated in FIG. 3, each cube 2 includes a CPU 22, an interface 23 (hereinafter, called as an "IF 23"), a communication circuit 21, an information-in-panel controller 24 as collection circuitry, an information-in-panel collection sensor 25, a camera 26, the electronic lock 27, a notification circuit 28, and a power supply 29. The CPU (central processing unit) 22 and the IF (interface) 23 function as a module enabling a function of each cube 2. The camera 26 is provided in the cube 2, and captures images of the module inside the cube 2. The electronic lock 27 and the notification circuit 28 are disposed at the door 6.

The power supply 29 converts electric power from the power supply BUS 71 into voltage suitable for each part in the cube 2 to supply to each part. The IF 23 is a communication interface between the communication circuit 21 and the CPU 22.

The information-in-panel collection sensor 25 is a sensor of, for example, temperature, humidity, vibration, voltage, and so on disposed at a position of each circuit and component in the cube 2, and detects information of operation state or operating environment (operation information) of the circuit and the component.

The information-in-panel controller (processing circuitry or a processor) 24 collects the operation information of the circuit and the component detected by the information-in-panel collection sensor 25, and outputs the collected operation information to an information management controller 15 of the control cabinet 1 through the communication circuit 12.

The information-in-panel controller 24 processes data collected by the information-in-panel collection sensor 25, the camera 26, the electronic lock 27, and so on in the cube 2, and communicates with the information management controller 15. The information management controller 15 consolidates information-in-panel of the plurality of cubes 2. The electronic lock 27 locks and unlocks the door 6 by control from the information management controller 15.

The notification circuit 28 notifies a state in the cube 2 or a position of the cube 2. The notification circuit 28 is a display device capable of changing a color in accordance with, for example, contents to be notified (an illumination device, an LED, and so on which transmits to a front surface of the door 6). The notification circuit 28 notifies the state (abnormality, access permission, and so on) in the cube 2 toward outside in different modes by changing a display color, or the like.

The control cabinet 1 is a casing for state monitoring of each cube 2, has a rectangular parallelepiped shape with 1800 mm in height, 600 mm in width, and 600 mm in depth, and has the same height and depth with the functional cabinet 4. The control cabinet 1 has an integral appearance shape (a size with the same height and width) with the functional cabinet 4 when it is made adjacent to the functional cabinet 4.

The control cabinet 1 has a monitoring and controlling function to monitor and control the cube 2 accommodated in the accommodation part 3. A touch panel 11 as a screen of a graphic user interface (GUI) is disposed at a cabinet surface of the control cabinet 1. In addition, the communication circuit 12, a memory 13, a data storage 14, and the information management controller 15 are disposed in the control cabinet 1.

The control cabinet 1 has the height for three pieces of cubes 2, and therefore, a tool box accommodating emergency goods such as a helmet in addition to inspection tools are accommodated at a lower stage at inside. A size of the tool box is the same size as the cube 2.

An illumination device is provided in the control cabinet 1. The illumination device is a battery drive type capable of being taken out at an emergency time.

The communication circuit 12 is connected to each cube 2 through a communication line, and they communicate with each other. Data exchanged with each cube 2 through the communication circuit 12 are stored in the data storage 14. The data storage 14 is used as a work area when the information management controller 15 performs processes.

The memory 13 is a random access memory capable of reading and writing information, and memorizes tables illustrated below and information such as an image, a position, an explanatory view of a module.

Figure 4:
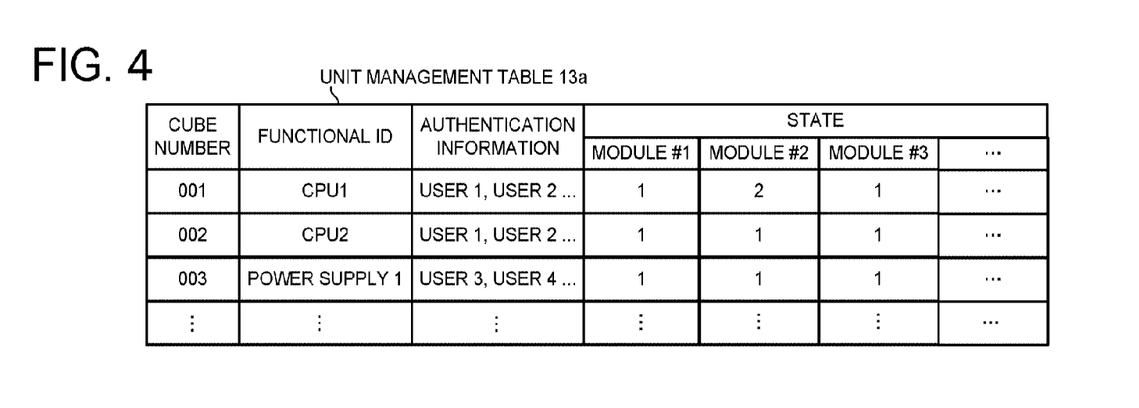
FIG. 4 is a view illustrating an example of a unit management table of the monitoring and controlling apparatus.
Figure 5:
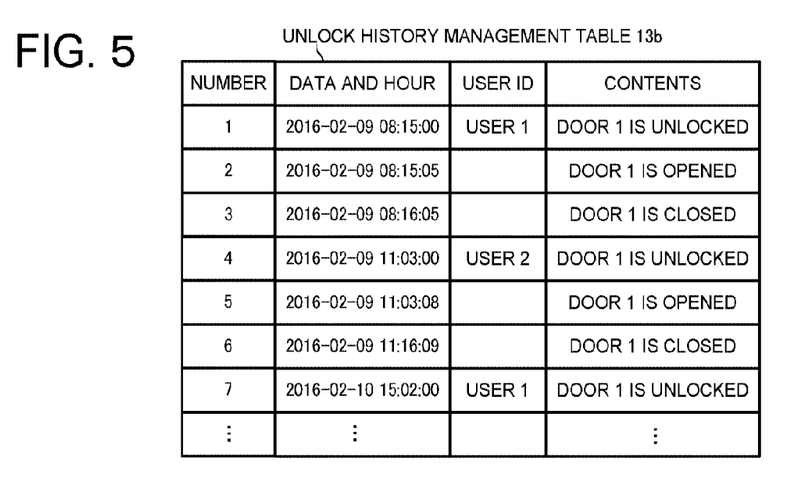
FIG. 5 is a view illustrating an example of an unlock history management table of the monitoring and controlling apparatus.

Namely, the memory 13 memorizes a cube management table 13a to manage each cube 2 (functional unit) and an unlock history management table 13b to manage an unlock history of the door 6. Note that the memory 13 can be commonly used with the data storage 14.

The memory 13 memorizes module IDs and positions of modules associated with each other. The module ID is information to identify the module such as the circuit and the component in each cube 2 (functional unit). The position of the module can be expressed by coordinates on the image 61 (refer to FIG. 8) of the camera 26 provided in the cube 2. Note that an image photographed by another camera in advance, an image view of a supply layout can be used as the image 61 in addition to the image of the camera 26.

Further, related information such as data of explanatory views relating to the module (the circuit and the component) is stored in the memory 13. Namely, the memory 13 memorizes the identification information of the modules (the module ID), the positions of the modules in the image of the camera 26, and the related information relating to the modules associated with each other.

As illustrated in FIG. 4, the cube management table 13a memorizes cube numbers, functional IDs, authentication information, and flags associated with each other. The cube number is information to specify the cube 2 accommodating the module such as the circuit and the component. The functional ID is information to identify the function of the cube 2. The authentication information is information to identify a user capable of getting access to the cube 2. The flag is information indicating a state of the module.

Namely, the cube management table 13a memorizes the functional IDs being the identification information indicating the function of each cube 2, the cube numbers (unit numbers) each accommodating the module, and the flags indicating the operation states by each module associated with each other.

The cube number is, for example, 001, 002, 003 . . . , and so on. The functional ID indicates the function of each cube 2 such as a CPU 1, a CPU 2, a power supply 1 . . . , and so on. The authentication information is made up of, for example, a pair (combination) of a user ID and a password.

The authentication information capable of getting access to the cube number 001 is, for example, a user 1 and a user 2. The authentication information capable of getting access to the cube number 003 is, for example, a user 3 and a user 4. For example, a flag "1" indicates a normal operation, and a flag "2" indicates failure, and a flag "0" indicates access permission.

As illustrated in FIG. 5, the unlock history management table 13b memorizes "date and hour", "user IDs" and "contents" among the authentication information in serial order of the registered record associated with each other. The contents are, for example, states of the door 6 such as "a door 1 is unlocked", "the door 1 is opened", "the door 1 is closed".

The information management controller (processing circuitry, processor) 15 updates the flag of the module in the cube management table 13a based on the information-in-panel input from the information-in-panel controller 24. Besides, when the flag is updated and occurrence of change in a value of the flag is detected, the information management controller 15 specifies, for example, the module where the abnormality is detected and the cube 2 accommodating this module. Correspondence information of the notification circuits 28 between the cube 2 and the door 6 is set in advance.

The information management controller 15 outputs a notification control signal indicating the abnormality to the notification circuit 28 of the specified cube 2, and makes the notification circuit 28 of the door 6 operate (a red LED is turned on in case of the abnormality) or the like. As a result, the abnormality in the cube 2 is notified.

Besides, the information management controller 15 specifies, for example, the cube 2 which is access-permitted by user authentication, outputs the notification control signal of the access permission for the notification circuit 28 of the specified cube 2 to make the notification circuit 28 operate (a green LED is turned on in case of the access permission). As a result, the operator is able to visually recognize the accessible cube 2.

Namely, the information management controller 15 makes the notification circuit 28 at the door 6 of the cube 2 with unlocked electronic lock 27 notify the abnormality or the access permission in different modes from one another as the state in the cube 2.

In addition, the information management controller 15 performs user authentication based on the authentication information input to the touch panel 11 to unlock the door 6 of the cube 2. As a result, the information management controller 15 unlocks the electronic lock 27 of the door 6 of the cube 2 for a user having an access authority to the cube 2 to open the door 6.

The information management controller 15 performs the user authentication based on the authentication information input to the touch panel 11. As a result, the information management controller 15 displays the image of the camera 26 where the inside of the cube 2 is image-captured and/or the image photographed by another camera in advance and the image view of the supply layout on the touch panel 11 for the user (operator) having the access authority to the cube 2.

The information management controller 15 refers to the memory 13, and supplies and displays information (a closing line 63 illustrated in FIG. 8) indicating an abnormal portion (a portion where the state changes) at the position of the module in the image of the camera 26 corresponding to the specified module. When the abnormal portion displayed on the touch panel 11 is touch-operated, the information management controller 15 reads related information such as an explanatory view relating to the module from the memory 13, and displays on the touch panel 11.

Figure 6:
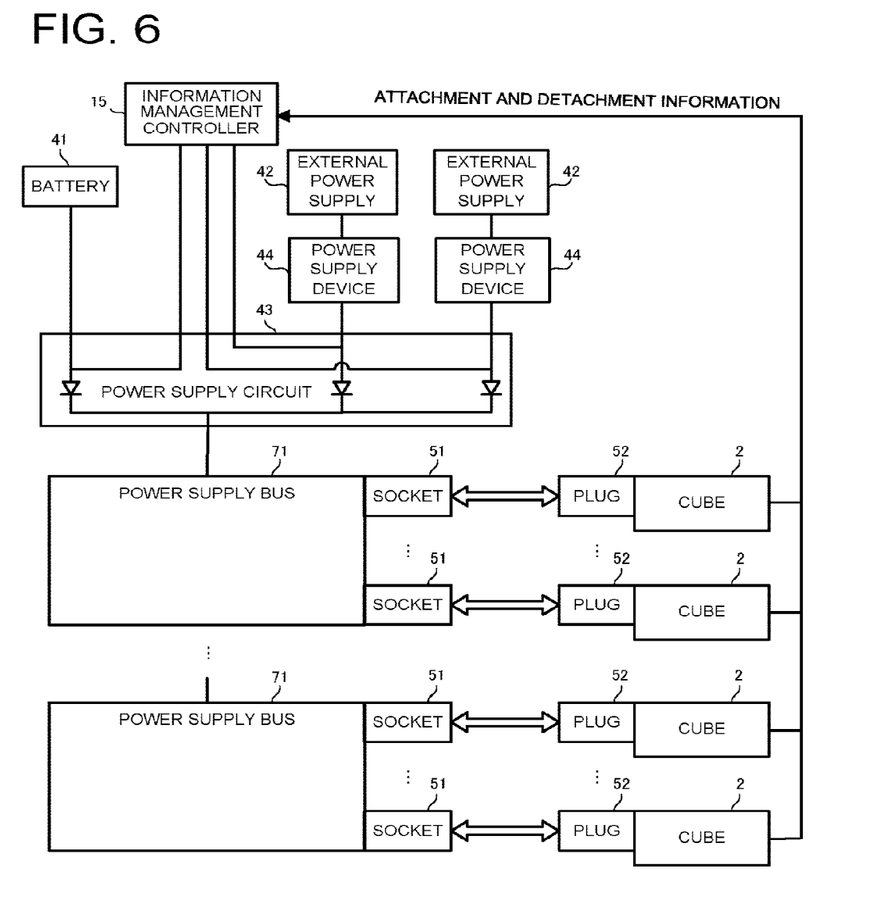
FIG. 6 is a view illustrating a configuration of a control system of power supply relations of the monitoring and controlling apparatus.

As illustrated in FIG. 6, the functional cabinet 4 of the monitoring and controlling apparatus has a power supply circuit 43. This power supply circuit 43 is monitored by the information management controller 15 in the control cabinet 1. A voltage supplied from a battery 41, or a predetermined voltage supplied from an external power supply 42 (a commercial power supply, a direct current power supply, and so on), and converted by a power supply device 44 is compared at the power supply circuit 43, and thereafter, supplied to each cube 2 through the power supply BUS 71.

The power supply BUS 71 and each cube 2 are connected to be insertable and removable by the socket 51 and the plug 52. When a certain cube 2 is drawn out from the accommodation part 3 of the functional cabinet 4, the plug 52 of the cube 2 is disengaged from the socket 51. This attachment and detachment of the plug 52 is detected by the information-in-panel collection sensor 25, and attachment and detachment information is output from the cube 2 to the information management controller 15. The attachment and detachment information contains the identification information of the module (module ID) in the cube 2 whose plug 52 is disengaged in addition that it is connected or disconnected.

Figure 7:
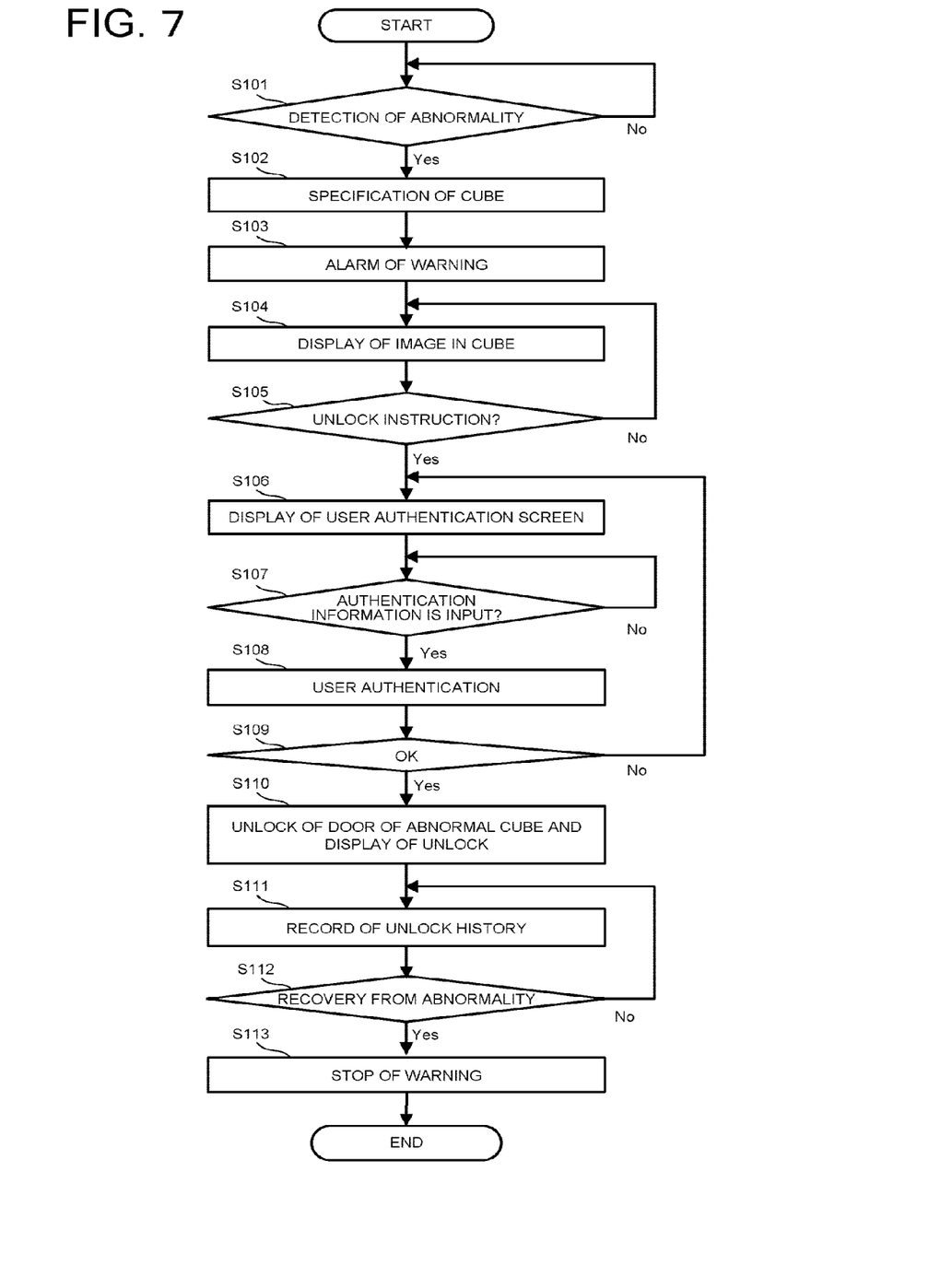
FIG. 7 is a flowchart illustrating operations of the monitoring and controlling apparatus.

Hereinafter, operations of the monitoring and controlling apparatus of the embodiment are described with reference to a flowchart in FIG. 7, FIG. 8 and FIG. 9.

In case of the monitoring and controlling apparatus of the embodiment, when abnormality occurs at the module in a certain cube 2, the information-in-panel collection sensor 25 detects the abnormality. The information-in-panel controller 24 collects the operation information of the module detected by the information-in-panel collection sensor 25, and outputs the collected operation information to the information management controller 15 of the control cabinet 1 through the communication circuit 12.

The information management controller 15 updates the flag of the module in the cube management table 13*a* by the received operation information, and checks the operation state of each module from a state of the updated flag.

As a result of this check, for example, when the flag of a module #2 becomes "2" as the cube management table 13*a* in FIG. 4, the information management controller 15 detects the abnormality of the module #2 of the cube 2 (Yes in step S101 in FIG. 7), and specifies the cube 2 from the cube number in the cube management table 13*a*(step S102).

The information management controller 15 rings (alarms) a warning sound or the like from, for example, a warning device or the like to notify the abnormality of the specified cube 2 (step S103), and notifies the operator of the abnormal state. At this time, the abnormality may be displayed on the notification circuit 28 of the cube 2.

The operator who hears the warning reaches the position of the control cabinet 1, and touches the touch panel 11. As a result, the information management controller 15 displays the image 61 (refer to FIG. 8) of the camera 26 provided in the cube 2 where the abnormality is detected or the image photographed by another camera in advance and the image view of the supply layout on a screen of the touch panel 11 (step S104).

In this case, the information management controller 15 refers to the memory 13, and supplies information indicating the abnormal portion at the position of the failed module in the image 61 of the camera 26 or the image photographed by another camera in advance and the image view of the supply layout corresponding to the specified module.

Figure 8:
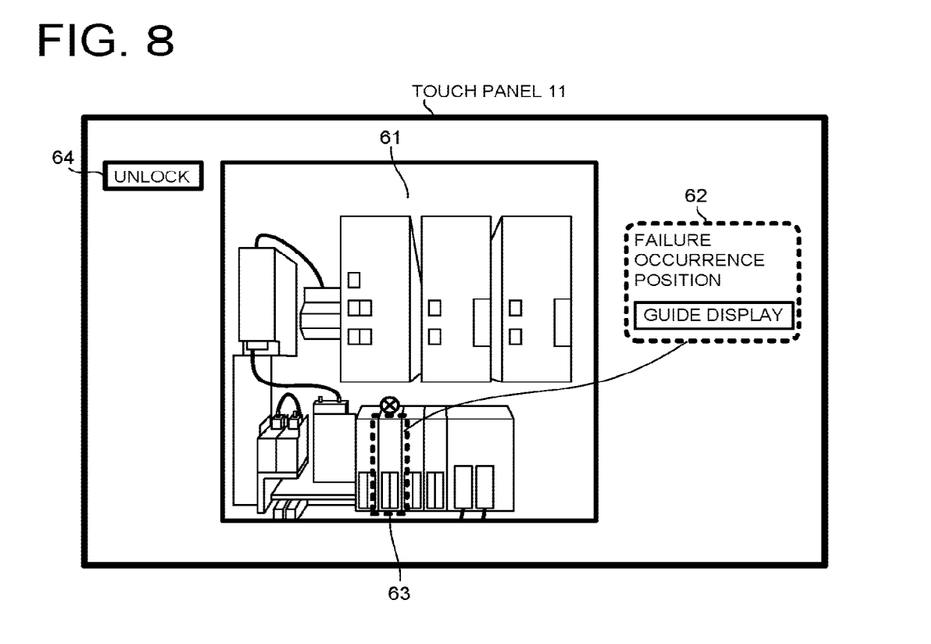
FIG. 8 is a view illustrating an example of a monitoring image in a cube displayed on a touch panel.

As illustrated in FIG. 8, a guide display 62 of the abnormality occurrence position, the closing line 63 indicating the position of the module where the abnormality is detected, and so on are thereby displayed while superimposed on the image 61 together with the image 61 in the cube 2 where the abnormality is detected on the screen of the touch panel 11. The guide display 62 is, for example, an explanation of a state of the module, or the like.

Figure 9:
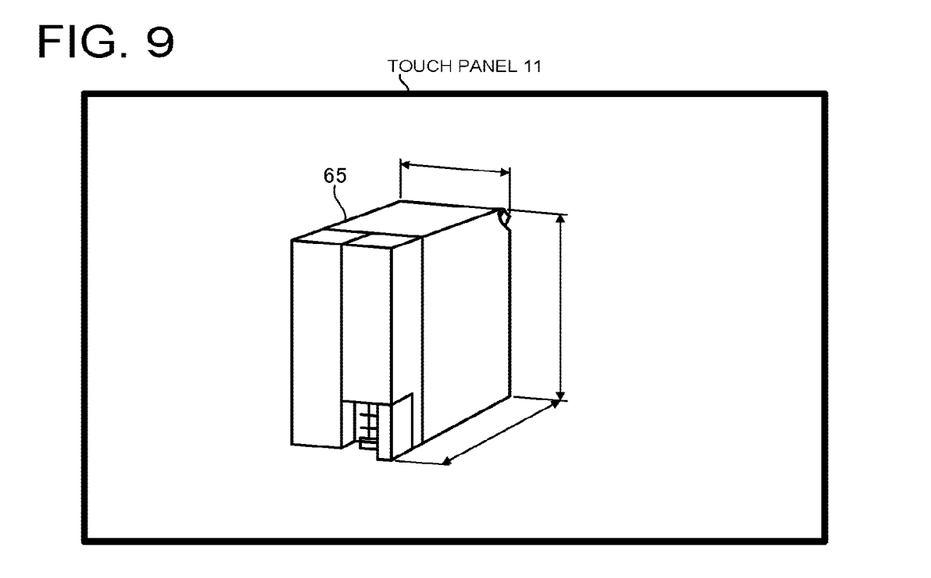
FIG. 9 is a view illustrating a display example of an explanatory view of a failed module.

Here, when the closing line 63 at the abnormal portion is touch-operated in the screen of the touch panel 11, the information management controller 15 reads an explanatory view 65 relating to the module at the abnormal portion from the memory 13, and displays on the tough panel 11 as illustrated in FIG. 9. Thus, the operator is able to immediately understand the function and a structure, an exchange procedure on site, and so on of the module where the abnormality occurs, and to perform the exchange operation in a while.

An unlock button 64 is disposed beside the image 61 of the touch panel 11. When the operator touch-operates this unlock button 64 to perform repair or recovery of the module, the information management controller 15 sets this operation as an unlock instruction (Yes in step S105), and displays an authentication information input screen (not-illustrated) by the operator on the touch panel 11 (step S106).

When the authentication information (the user ID and the password) are input for the authentication information input screen displayed on the touch panel 11 (Yes in step S107), the information management controller 15 refers to the cube management table 13a, collates the input authentication information with the authentication information registered to the cube management table 13a in advance, and performs the user authentication (step S108).

When a user is found to have the access authority to the cube 2 as a result of the user authentication (Yes in step S109), the information management controller 15 controls and unlocks the electronic lock 27 of the door 6 of the cube 2, and makes the notification circuit 28 of the door 6 of the cube 2 notify that the door is unlocked (step S110).

Namely, when the user is found to have the access authority to the cube 2 as the result of the user authentication based on the authentication information input to the touch panel 11, the electronic lock 27 of the door 6 of the cube 2 is unlocked, and an unlock display indicating the unlock of the door 6 is performed at the door 6 of the abnormal cube 2.

Note that, for example, when an access instruction operation to the cube 2 is performed by the operator after the user authentication, the information management controller 15 transmits a notification control signal of access permission to the notification circuit 28 provided at the door 6 of the cube 2, and makes the notification circuit 28 of the door 6 of the cube 2 notify the access permission, in addition to the abnormal time. The operator is thereby able to easily determine which door 6 is to be opened to get access to a desired function.

After the unlock, the information management controller 15 performs a record sequential recording (storing) of the unlock history on the unlock history management table 13b based on unlock/lock information of the electronic lock 27 and open/close information of the door 6 input from the information-in-panel controller 24 (step S111).

Contents of the unlock history management table 13b, namely, logs where the unlock history is recorded can be browsed by a browsing operation from a person who has the access authority after the user authentication for the touch panel 11.

When the module where the abnormality is detected operates normally, the information management controller 15 judges as recovery from abnormality based on the operation information from the information-in-panel controller 24 (Yes in step S112), and stops the alarm of the warning of abnormality (step S113).

Note that an operation example as stated above is one example, and various changes of the operation procedure are possible by exchanging each step, adding a new step, and deleting a part of the steps.

The monitoring and controlling apparatus of the embodiment has the control cabinet 1 mainly performing monitoring and controlling, and the functional cabinet 4 where the plurality of cubes 2 with an unit function are accommodated. The operation information of the module of each cube 2 is collected by the information-in-panel controller 24 in each cube 2, and received by the information management controller 15 of the control cabinet 1. The information management controller 15 manages the operation state of each module as needed based on the operation information. When the information management controller 15 detects the abnormality of a certain module, it specifies the cube 2 accommodating the module, and issues the warning of abnormality. The information management controller 15 performs the user authentication through the touch panel 11, and thereafter, unlocks the door 6 of the specified cube 2, and makes the notification circuit 28 provided at the door 6 notify the state of the cube 2. As a result, during the recovery, maintenance, update, and expansion of functions, a proper operator is able to get access to an object function, and promptly operate while securing security.

The touch panel 11 of the monitoring and controlling apparatus illustrated in the embodiment may be provided detachably from the control cabinet 1, and the touch panel 11 and the information management controller 15 may be connected in wireless or wired. The operator is able to work while carrying the touch panel 11, and to proceed the recovery operation more smoothly.

Besides, each function of the monitoring and controlling apparatus may be enabled by a program installed in a storage such as a hard disk device of a computer. This program may be stored in a computer readable electronic media. The program is read by the computer, and thereby, each function is enabled on the computer. Examples of the electronic media include a recording media such as a CD-ROM, a flash memory, and a removable media. Further, a plurality of computers having respective functions are communicated through a network, to thereby make up a monitoring and controlling system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A monitoring and controlling apparatus, comprising:
a functional cabinet including a plurality of frames and a door at an opening of at least a part of the frames, each frame having a predetermined accommodation size;
a plurality of functional units, each functional unit being detachably accommodated in respective frame and including a circuit and a component for a function of the functional unit; and
a control cabinet disposed next to the functional cabinet and configured to monitor and control the functional units,
wherein the functional unit includes:
collection circuitry configured to collect and output operation information of the circuit and the component; and
a notification circuit configured to notify a state in the functional unit or a position of the functional unit,
wherein the control cabinet includes:
a management table configured to memorize unit numbers of the functional units, identification information indicating functions of the functional units, and flags indicating operation states of the circuits and the components associated with each other; and
a controller configured to detect a change of the flags when the flag of the operation state of the circuit and the component in the management table is updated, to specify the circuit and the component corresponding to the flag and the functional unit accommodating the circuit and the component based on the operation information output from the collection circuitry, and to make the notification circuit of the specified functional unit notify the position or the operation state of the functional unit.

2. The monitoring and controlling apparatus according to claim 1,
wherein the control cabinet includes a touch panel at a cabinet front surface for displaying information, and
wherein the controller opens the door of the functional unit when authentication information to unlock the functional unit inputted from the touch panel indicates access authority to the functional unit.

3. The monitoring and controlling apparatus according to claim 1,
wherein the controller makes the notification circuit notify abnormality or access permission in different modes as a state in the functional unit.

4. The monitoring and controlling apparatus according to claim 1,
wherein the functional unit includes a camera configured to capture an image in the functional unit,
wherein the control cabinet includes a touch panel for displaying information at a cabinet front surface,
wherein the controller makes the touch panel display an image in the functional unit captured by the camera when authentication information inputted from the touch panel indicates the access authority to the functional unit.

5. The monitoring and controlling apparatus according to claim 4,
wherein the control cabinet includes a memory configured to memorize identification information of the circuits and the components, positions of the circuits and the components in the captured image, and information relating to the circuits and the components associated with each other,
wherein the controller reads the memory, and makes the touch panel display the captured image and information indicating a portion where a state changes at the position of the circuit and the component in the captured image corresponding to the specified circuit and component, and
when the portion displayed on the touch panel is touch-operated, the controller reads the information relating to the circuit and the component from the memory to make the touch panel display the information.

6. The monitoring and controlling apparatus according to claim 1, wherein the functional cabinet includes:
a busbar disposed in a vertical direction at a back side of the frame, and configured to output power; and
a connector detachably connected to the busbar directly or with a contact member therebetween, to supply power to each functional unit.

7. A monitoring and controlling apparatus, comprising:
a functional cabinet including a plurality of frames and a door at an opening of at least a part of the frames, each frame having a predetermined accommodation size;
a plurality of functional units, each functional unit being detachably accommodated in respective frame and including a circuit and a component for a function of the functional unit; and
a control cabinet disposed next to the functional cabinet and configured to monitor and control the functional units, the control cabinet including an information management controller,
wherein the functional cabinet includes:
a power supply circuit monitored by the information management controller in the control cabinet;
a power supply bus disposed in a vertical direction at a back side of the frame, and configured to output power; and
an electric connector detachably connected to the power supply bus directly or with a contact member therebetween, to supply power to each functional unit.

* * * * *